US008164178B2

(12) United States Patent
Katsuki et al.

(10) Patent No.: US 8,164,178 B2
(45) Date of Patent: Apr. 24, 2012

(54) CHIP-TYPE SEMICONDUCTOR CERAMIC ELECTRONIC COMPONENT

(75) Inventors: Takayo Katsuki, Omihachiman (JP); Yoshiaki Abe, Higashiomi (JP)

(73) Assignee: Murata Manufacturing Co., Ltd., Nagaokakyo-Shi, Kyoto-fu (JP)

( * ) Notice: Subject to any disclaimer, the term of this patent is extended or adjusted under 35 U.S.C. 154(b) by 86 days.

(21) Appl. No.: 12/845,271

(22) Filed: Jul. 28, 2010

(65) Prior Publication Data

US 2010/0283114 A1 Nov. 11, 2010

Related U.S. Application Data

(63) Continuation of application No. PCT/JP2009/051075, filed on Jan. 23, 2009.

(30) Foreign Application Priority Data

Jan. 29, 2008 (JP) ................................ 2008-017063

(51) Int. Cl.
*H01L 23/00* (2006.01)

(52) U.S. Cl. ................. 257/703; 257/E23.009; 438/125

(58) Field of Classification Search .................. 257/703, 257/E23.009; 438/125
See application file for complete search history.

(56) References Cited

U.S. PATENT DOCUMENTS 4,853,271 A * 8/1989 Nakamura et al. .............. 428/81
5,527,992 A * 6/1996 Terajima ....................... 174/551
2006/0102991 A1* 5/2006 Sakano ......................... 257/678
2009/0167841 A1 7/2009 Wu
2010/0091477 A1* 4/2010 Takagi et al. ................. 361/820

FOREIGN PATENT DOCUMENTS

| | | | |
|---|---|---|---|
| JP | 56-106404 | A | 8/1981 |
| JP | 3-239302 | A | 10/1991 |
| JP | 4-188801 | A | 7/1992 |
| JP | 5-29115 | | 2/1993 |
| JP | 2001-210545 | | 8/2001 |
| JP | 2006-310700 | A | 11/2006 |
| WO | WO-2007-118472 | | 10/2007 |

OTHER PUBLICATIONS

PCT/JP2009/051075 International Search report dated Apr. 21, 2009.

* cited by examiner

*Primary Examiner* — Steven J Fulk
(74) *Attorney, Agent, or Firm* — Dickstein Shapiro LLP

(57) ABSTRACT

A chip-type semiconductor ceramic electronic component including a ceramic body made of a semiconductor ceramic, first external electrodes formed on opposite end surfaces of the ceramic body, and second external electrodes extending to cover surfaces of the first external electrodes and part of side surfaces of the ceramic body. A curvature radius of a corner portion of the ceramic body is R (μm), a maximum thickness of a layer of the first external electrode layer, which is in contact with the ceramic body, measured from the end surface of the ceramic body is y (μm), and a minimum thickness of a layer of the second external electrode, which is in contact with the side surface of the ceramic body, measured from an apex of the corner portion of the ceramic body is x (μm), and $20 \leqq R \leqq 50$, $-0.4\ x+0.6 \leqq y \leqq 0.4$ is satisfied when $0.5 \leqq x \leqq 1.1$, and $-0.0076\ x+0.16836 \leqq y \leqq 0.4$ is satisfied when $1.1 \leqq x \leqq 9.0$.

6 Claims, 4 Drawing Sheets

CHIP-TYPE SEMICONDUCTOR CERAMIC ELECTRONIC COMPONENT

CROSS REFERENCE TO RELATED APPLICATIONS

The present application is a continuation of International Application No. PCT/JP2009/051075, filed Jan. 23, 2009, which claims priority to Japanese Patent Application No. JP2008-017063, filed Jan. 29, 2008, the entire contents of each of these applications being incorporated herein by reference in their entirety.

FIELD OF THE INVENTION

The present invention relates to a chip-type semiconductor ceramic electronic component, e.g., a PTC thermistor, an NTC thermistor and a varistor, in which a ceramic body is made of a semiconductor ceramic.

BACKGROUND OF THE INVENTION

Recently, size reduction and surface mounting have been progressed in the field of electronic equipment. For example, in a chip-type semiconductor ceramic electronic component, e.g., a PTC thermistor, an NTC thermistor and a varistor, it has been progressed to manufacture the electronic component in the form of a chip. As an example of such a semiconductor electronic component in the form of a chip, there is known a chip-type semiconductor ceramic electronic component disclosed in Patent Document 1. FIG. 6 is a schematic sectional view of a known chip-type semiconductor ceramic electronic component 11 disclosed in Patent Document 1. In the chip-type semiconductor ceramic electronic component 11, as illustrated in FIG. 6, first external electrode layers 13*a* and 13*b* made of, e.g., Ni having an ohmic property with respect to a ceramic body 12 are formed at opposite end portions of the ceramic body 12. Further, second external electrode layers 14*a* and 14*b* made of Ag having superior soldering performance and providing higher mounting performance with respect to a substrate are formed on surfaces of the first external electrode layers 13*a* and 13*b*, respectively.

The chip-type semiconductor ceramic electronic component 11 is manufactured as follows. First, on surfaces of a mother substrate from which the ceramic body 12 is to be obtained, the first external electrodes 13*a* and 13*b* made of, e.g., Ni having an ohmic property with respect to the ceramic body 12 are formed by an electroless plating method, for example. Then, both principal surfaces of the mother substrate are polished to remove the first external electrodes 13*a* and 13*b*, which are formed on both the principal surfaces, so that the first external electrodes 13*a* and 13*b* are formed on only side surfaces and end surfaces of the mother substrate. The mother substrate is cut to provide the ceramic body 12 in such a state that the first external electrodes 13*a* and 13*b* are formed only on the opposite end surfaces of the ceramic body 12. Thereafter, the second external electrodes 14*a* and 14*b* are formed on the first external electrodes 13*a* and 13*b*, respectively, by immersing the opposite end surfaces of the ceramic body 12 in an Ag bath. As a result, the second external electrodes 14*a* and 14*b* are formed in a state extending over part of the side surfaces of the ceramic body 12.

However, when, as disclosed in Patent Document 1, the second external electrodes 14*a* and 14*b* are formed by immersing, in the Ag bath, the opposite end surfaces of the ceramic body 12 on which first external electrodes 13*a* and 13*b* are formed, the second external electrodes 14*a* and 14*b* are generally baked onto the ceramic body 12 and the first external electrodes 13*a* and 13*b* by applying heat at temperature of about 600 to 800° C. after the immersion into the Ag bath. At that time, the heat applied to bake the second external electrodes 14*a* and 14*b* is conducted to the first external electrodes 13*a* and 13*b* as well. Accordingly, as illustrated in FIG. 7, the first external electrodes 13*a* and 13*b* having an ohmic property with respect to the ceramic body 12 may be caused to spread over the side surfaces of the ceramic body 12 depending on conditions of the heat treatment.

It has been proved that the above-mentioned phenomenon causes a variation in resistance values among individual chip-type semiconductor ceramic electronic components 11. Especially, a resistance value of the electronic component varies depending on an area of each of the first external electrodes 13*a* and 13*b* and a distance between the first external electrodes 13*a* and 13*b* in the case of the chip-type semiconductor ceramic electronic component 1 which has no internal electrodes inside the ceramic body 12, in particular, the distance between the first external electrodes 13*a* and 13*b* greatly affects the variation in resistance values among the chip-type semiconductor ceramic electronic components 1. For example, if diffusion of the first external electrodes 13*a* and 13*b* reaches the side surfaces of the ceramic body 12 and the first external electrodes 13*a* and 13*b* spread partly over the side surfaces of the ceramic body 12, resistance between outer peripheral edges of the first external electrodes 13*a* and 13*b* spreading over the side surfaces affects the resistance value of the chip-type semiconductor ceramic electronic component 11. Thus, a variation in distance between the first external electrodes 13*a* and 13*b* among the individual chip-type semiconductor ceramic electronic components 11 leads to the variation in resistance values among them and causes a serious problem.

Meanwhile, FIG. 8 illustrates a PTC ceramic electronic component disclosed in Patent Document 2. Patent Document 2 discloses a PTC ceramic electronic component 21 in which first external electrodes 23*a* and 23*b* each made of a Cr film are formed not covering corners of a ceramic body 22, and second external electrodes 24*a* and 24*b* are formed so as to extend over side surfaces of the ceramic body 22. Patent Document 2 further discloses that the first external electrodes 23*a* and 23*b* are formed by sputtering, for example, and the second external electrodes 24*a* and 24*b* are formed by baking a paste for the external electrodes.

Patent Document 1: Japanese Unexamined Patent Application Publication No. 5-29115

Patent Document 2: WO2007/118472

Even with the structure disclosed in Patent Document 2, however, when the second external electrodes are formed by using the paste for the external electrodes after forming the first external electrodes, heat is applied to the first external electrodes because the paste for the external electrodes is applied and baked by heat treatment.

For that reason, the first external electrodes may diffuse into the second external electrodes by application of heat, and the diffusion of the first external electrodes may spread up to portions of the second external electrodes, which extend over the side surfaces of the ceramic body, depending on conditions. This gives rise to a risk that the second external electrodes are given with the ohmic property and a variation in resistance values cannot be prevented satisfactorily.

Further, if the first external electrodes diffuse into the second external electrodes present on the end surfaces of the ceramic body, joining strength between the ceramic body and the first external electrodes reduces. Accordingly, the ohmic contact between the first external electrodes and the ceramic body is not obtained in some portions at a sufficient level, and a resistance change is increased in, e.g., a temperature cycle test that is conducted by repeatedly applying high and low temperatures (hereinafter referred to as "thermal shocks"). Thus, satisfactory reliability cannot be obtained in some cases.

SUMMARY OF THE INVENTION

In view of the above-described points, an object of the present invention is to provide a chip-type semiconductor ceramic electronic component including thin-film first external electrodes and thick-film second external electrodes which are formed on opposite end surfaces of a ceramic body, wherein even when the chip-type semiconductor ceramic electronic component includes the second external electrodes formed by an electrode forming method using heat treatment, a variation in resistance values among individual electronic components is small and the resistance change caused by the thermal shocks is also small.

In a chip-type semiconductor ceramic electronic component including a ceramic body made of a semiconductor ceramic, first external electrodes formed on opposite end surfaces of the ceramic body, and second external electrodes extending to cover surfaces of the first external electrodes and part of side surfaces of the ceramic body, corner portions defined by the side surfaces and the end surfaces of the ceramic body have curved surfaces, a curvature radius of the corner portion of the ceramic body is assumed to be R (μm), the first external electrodes are each made of a material having an ohmic property with respect to the ceramic body, a maximum thickness of a layer of the first external electrode layer, which is in contact with the ceramic body, measured from the end surface of the ceramic body is assumed to be y (μm), the second external electrodes are each made of a material not having an ohmic property with respect to the ceramic body, and a minimum thickness of a layer of the second external electrode, which is in contact with the side surface of the ceramic body, measured from an apex of the corner portion of the ceramic body is assumed to be x (μm), R, x and y satisfying relationships of $20 \leqq R \leqq 50$, $-0.4x+0.6 \leqq y \leqq 0.4$ on condition of $0.5 \leqq x \leqq 1.1$, and $-0.0076x+0.16836 \leqq y \leqq 0.4$ on condition of $1.1 \leqq x \leqq 9.0$.

In a chip-type semiconductor ceramic electronic component according to a second aspect of the present invention, preferably, outer peripheral edges of the first external electrodes are each formed to be positioned closer to a center of the end surface than an apex of the curved surface.

In a chip-type semiconductor ceramic electronic component according to a third aspect of the present invention, preferably, the first external electrodes are thin-film electrodes and the second external electrodes are thick-film electrodes.

In a chip-type semiconductor ceramic electronic component according to a fourth aspect of the present invention, preferably, the first external electrode is in the form of plural layers, a layer of the first external electrode, which is in contact with the ceramic body, is a Cr layer, the second external electrode is in the form of plural layers, and a layer of the second external electrode, which is in contact with the side surface of the ceramic body, is an Ag layer.

According to a first aspect of the present invention, by forming outer peripheral edges of the first external electrodes having an ohmic property with respect to the ceramic body inward of outer peripheral edges of the end surfaces of the ceramic body, and by setting the parameters R, x and y, i.e., the curvature radius R of each of the corner portions defined by the side surfaces and the end surfaces of the ceramic body, the maximum thickness y of the layer of the first external electrode layer, which is in contact with the ceramic body, measured from the end surface of the ceramic body, and the minimum thickness x of the layer of the second external electrode, which is in contact with the side surface of the ceramic body, measured from the apex of the corner portion of the ceramic body, so as to fall within the above-mentioned numerical ranges defined in the present invention, it is possible to prevent the first external electrodes from not only diffusing up to the side surfaces of the ceramic body, but also diffusing into the second external electrodes, even when the second external electrodes are formed by, e.g., an electrode forming method that performs heat treatment such as baking of electrodes. Further, the above-described constitution reliably ensures the function of the second external electrodes which are each made of the material not having an ohmic property with respect to the ceramic body, and which do not contribute to an essential resistance value that affects a resistance-temperature characteristic of the ceramic body. In other words, the second external electrodes can be prevented from being given the unintended ohmic property, and the essential resistance value can be obtained with the first external electrodes which are formed on the opposite end surfaces of the ceramic body. Moreover, with satisfaction of the numerical ranges defined in the present invention, the ohmic property between the first external electrodes and the ceramic body can be held at a satisfactory level, whereby the variation in resistance values can be reduced and the resistance change caused by thermal shocks can also be reduced. Accordingly, even when the second external electrodes are formed to cover part of the side surfaces of the ceramic body for the purpose of increasing a connection area with respect to a substrate and stabilizing mounting of the ceramic body onto the substrate, the variation in resistance values can be suppressed which may occur due to, e.g., diffusion of the first external electrodes up to the side surfaces of the ceramic body and into the second external electrodes. In addition, a chip-type semiconductor ceramic electronic component can be obtained in which satisfactory connection between the electronic component and the substrate is ensured when the electronic component is mounted onto the substrate.

According to the second aspect of the present invention, since the corner portions defined by the side surfaces and the end surfaces of the ceramic body have curved surfaces and the outer peripheral edges of the first external electrodes are each formed to be positioned closer to the center of the end surface than the apex of the curved surface, the first external electrodes can be more reliably prevented from diffusing up to the side surfaces of the ceramic body, and the distance between the first external electrodes is substantially the same as the distance between opposite end surfaces of the chip-type semiconductor ceramic electronic component. Therefore, only the distance between the first external electrodes needs to be taken into consideration as a factor affecting a resistance value of the chip-type semiconductor ceramic electronic component, and the resistance value is substantially determined depending on the size of the chip-type semiconductor ceramic electronic component. As a result, the variation in resistance values among individual chip-type semiconductor ceramic electronic components can be suppressed more positively.

According to the third aspect of the present invention, the first external electrodes are formed of thin films and the second external electrodes are formed of thick films. With the first external electrodes formed of thin films, a distance through the first external electrodes diffuse can be reduced even when heat treatment, such as baking, is performed in a step of forming the second external electrodes. As a result, an influence caused by the first external electrodes extending over the side surface of the ceramic body can be held smaller.

According to the fourth aspect of the present invention, the first external electrode is in the form of plural layers, the layer of the first external electrode, which is in contact with the ceramic body, is made of Cr, the second external electrode layer is in the form of plural layers, and the layer of the second external electrode, which is in contact with the side surface of the ceramic body, is made of Ag. With such a constitution, the variation in resistance values depending on the distance between the first external electrodes and the resistance change caused by thermal shocks can be reliably reduced, and a chip-type semiconductor ceramic electronic component superior in electrical connection performance can be obtained.

One embodiment of the chip-type semiconductor ceramic electronic component according to the present invention will be described in detail below with reference to the drawings.

REFERENCE NUMERALS

1 chip-type semiconductor ceramic electronic component
2 ceramic body
3*a*,3*b* first external electrodes
4*a*,4*b* second external electrodes

DETAILED DESCRIPTION OF THE INVENTION

Figure 1:
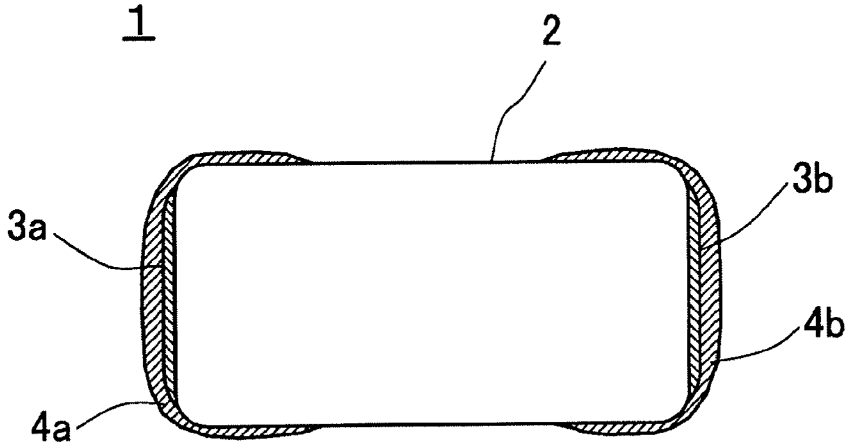
FIG. 1 is a schematic side sectional view of one embodiment of a chip-type semiconductor ceramic electronic component according to the present invention.
Figure 2:
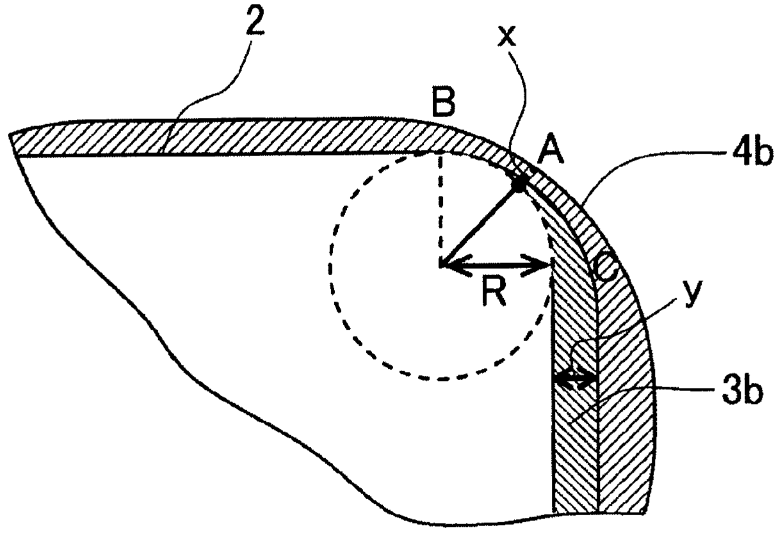
FIG. 2 is a partial enlarged sectional view of a corner portion in FIG. 1.
Figure 3:
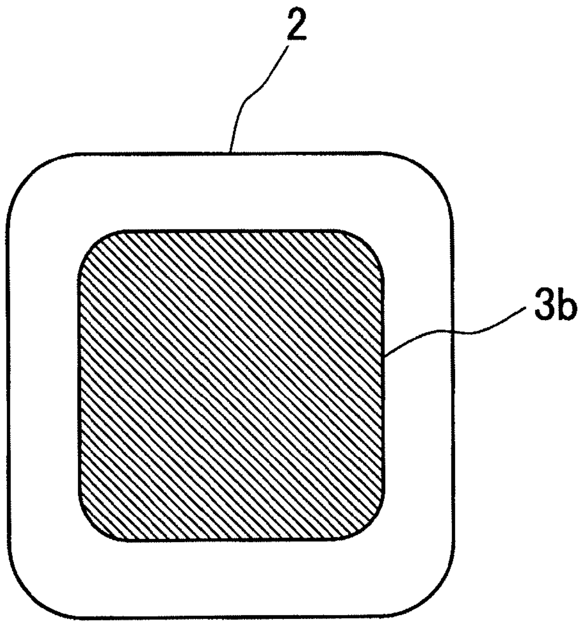
FIG. 3 is a side view of the chip-type semiconductor ceramic electronic component according to the present invention in a state where first external electrodes 3*a* and 3*b* are formed, the view looking at an end surface of the electronic component.
Figure 4:
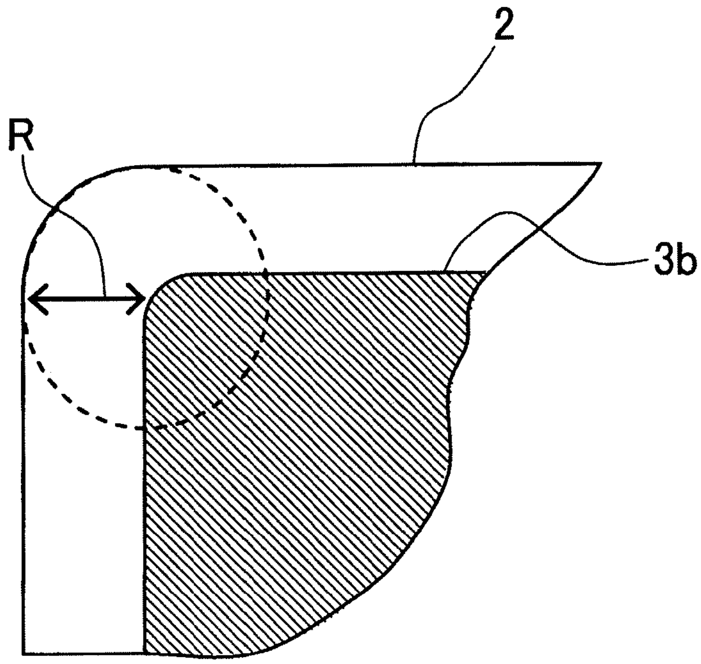
FIG. 4 is a partial enlarged view of a corner portion in FIG. 3.

FIG. 1 is a schematic sectional view illustrating one embodiment of a chip-type semiconductor ceramic electronic component 1 according to the present invention. FIG. 2 is a partial enlarged sectional view of a corner portion of the chip-type semiconductor ceramic electronic component 1 according to the present invention. FIG. 3 is a side view of the chip-type semiconductor ceramic electronic component 1 according to the present invention in a state where first external electrodes 3*a* and 3*b* are formed, the view looking at an end surface of the electronic component. FIG. 4 is a partial enlarged view of a corner portion in FIG. 3.

In the chip-type semiconductor ceramic electronic component 1 according to the present invention, illustrated in FIG. 1, the first external electrodes 3*a* and 3*b* are formed on opposite end surfaces of a ceramic body 2 that is made of a semiconductor ceramic, and second external electrodes 4*a* and 4*b* are formed on surfaces of the first external electrodes 3*a* and 3*b*, respectively.

At least portions of the first external electrodes 3*a* and 3*b*, which are in contact with the ceramic body 2, are each made of a material having an ohmic property with respect to the ceramic body 2. As illustrated in the side view of FIG. 3 looking at the end surface of the chip-type semiconductor ceramic electronic component, outer peripheral edges of the first external electrodes 3*a* and 3*b* are positioned inward of outer peripheral edges of the end surface of the ceramic body 2. On the first external electrodes 3*a* and 3*b*, the second external electrodes 4*a* and 4*b* each made of a material not having an ohmic property with respect to the ceramic body are formed respectively so as to extend in a state covering part of side surfaces of the ceramic body.

With such a structure that at least the portions of the first external electrodes 3*a* and 3*b*, which are in contact with the ceramic body, are each made of the material having an ohmic property with respect to the ceramic body 2 and the outer peripheral edges of the first external electrodes 3*a* and 3*b* are positioned inward of the outer peripheral edges of the end surface of the ceramic body 2, even when the second external electrodes 4*a* and 4*b* are formed by, e.g., an electrode forming method that performs heat treatment such as baking of electrodes, the first external electrodes 3*a* and 3*b* can be prevented from diffusing up to the side surfaces of the ceramic body 2. Further, since the second external electrodes 4*a* and 4*b* are each made of the material not having an ohmic property with respect to the ceramic body 2, an essential resistance value of the chip-type semiconductor ceramic electronic component 1 is given as a value that is provided between the first external electrodes 3*a* and 3*b* even when the second external electrodes 4*a* and 4*b* are formed so as to cover part of the side surfaces of the ceramic body 2 for the purpose of ensuring positive connection between a substrate and the chip-type semiconductor ceramic electronic component 1 when the electronic component 1 is mounted onto the substrate. Stated another way, since the first external electrodes 3*a* and 3*b* do not diffuse up to the side surfaces of the ceramic body 2, the first external electrodes 3*a* and 3*b* have no portions extending over the side surfaces of the ceramic body 2 and generating a resistance value therebetween, and the resistance value of the electronic component 1 can be determined by the first external electrodes 3*a* and 3*b* which are substantially positioned between the opposite end surfaces of the ceramic body 2. As a result, individual chip-type semiconductor ceramic electronic components 1 having a small variation in their resistance values can be obtained.

Preferably, each of corner portions defined between the side surfaces and the end surfaces of the ceramic body 2 has a curved surface, and the outer peripheral edges of the first external electrodes 3*a* and 3*b* are each formed to be positioned closer to the end surface than an apex A of the curved surface. Assuming that, as illustrated in FIG. 2 representing the side sectional view of the chip-type semiconductor ceramic electronic component 1, points where normal lines extending from a center O of a circle having a curvature of the corner portion perpendicularly intersect with respectively the side surface and the end surface of the ceramic body 2 are denoted by B and C, the term "apex A of the curved surface" indicates a position which is located between the points B and C and which is angularly spaced about 45° from the normal line O-B or the normal line O-C. With the outer peripheral edges of the first external electrodes 3*a* and 3*b* being each positioned closer to a center of the end surface of the ceramic body 2 than the apex A of the curved surface, the distance from the apex A of the corner portion to the point B is sufficiently long and the diffusion of the first external electrodes 3*a* and 3*b* directing from the point A toward the point B along the surface of the ceramic body 2 can be effectively suppressed even when the second external electrodes 4*a* and 4*b* are formed by the electrode forming method that performs the heat treatment such as baking. As a result, the first external electrodes 3*a* and 3*b* can be prevented from diffusing up to the side surfaces of the ceramic body 2, and the resistance value contributing to a resistance-temperature characteristic of the chip-type semiconductor ceramic electronic component 1 can be substantially determined depending on the distance between the first external electrodes 3*a* and 3*b*, i.e., the distance between the end surfaces of the ceramic body 2. Hence, a variation in resistance values can be held smaller.

Further, at least the portions of the first external electrodes 3*a* and 3*b*, which are in contact with the ceramic body, are each made of the electrode material having an ohmic property with respect to the ceramic body 2, and the second external electrodes 4*a* and 4*b* are each made of the electrode material not having an ohmic property with respect to the ceramic body 2, i.e., not contributing to the resistance characteristic. Because the ceramic body 2 of the chip-type semiconductor ceramic electronic component 1 is made of a semiconductor ceramic, whether the characteristic is developed or not depends on the material of the first external electrodes 3*a* and 3*b* in contact with the ceramic body 2. When the ceramic body 2 of the chip-type semiconductor ceramic electronic component 1 is made of, e.g., an N-type semiconductor having a positive resistance-temperature characteristic, it is preferable that a base metal, such as Cr, NiCr or Ti, is used for the first external electrodes 3*a* and 3*b*, whereas a noble metal, such as Ag or AgPd, not having the ohmic property is used for the second external electrodes 4*a* and 4*b*. Also, when the ceramic body 2 is made of, e.g., a P-type semiconductor having a negative resistance-temperature characteristic, it is preferable that the noble metal, such as Ag or AgPd, is used for the first external electrodes 3*a* and 3*b*, whereas the base metal, such as Cr, CuNi or Ti, is used for the second external electrodes 4*a* and 4*b*. Thus, the material having the ohmic property and the material not having the ohmic property can be variously selected depending on semiconductor characteristics of materials used for the ceramic body 2. Note that the first external electrodes 3*a* and 3*b* and the second external electrodes 4*a* and 4*b* are each not limited to the form of a single layer. Each of those external electrodes may be formed in plural layers. For example, when the first external electrodes 3*a* and 3*b* are each formed in plural layers, at least layers of the first external electrodes 3*a* and 3*b*, which are in contact with the ceramic body 2, are required to have the ohmic property, and layers of the first external electrodes 3*a* and 3*b*, which are in contact with the second external electrodes 4*a* and 4*b*, are not always required to have the ohmic property.

While the above-described structure can reduce the variation in resistance values to some extent, the present invention is additionally featured in the following point. Assuming that a curvature radius of the corner portion of the ceramic body is R (μm), a maximum thickness of the layer of the first external electrode, which is in contact with the ceramic body, measured from the end surface of the ceramic body is y (μm), and a minimum thickness of the layer of the second external electrode, which is in contact with the side surface of the ceramic body, measured from the apex A of the corner portion of the ceramic body is x (μm), $20 \leqq R \leqq 50$ is satisfied, $-0.4x+0.6 \leqq y \leqq 0.4$ is satisfied on condition of $0.5 \leqq x \leqq 1.1$, and $-0.0076x+0.16836 \leqq y \leqq 0.4$ is satisfied on condition of $1.1 \leqq x \leqq 9.0$.

By satisfying the above-mentioned numerical ranges, the first external electrode can be prevented from diffusing into the second external electrode. Therefore, the second external electrode is not given with the ohmic property and the variation in resistance values can be suppressed with higher reliability. Further, the ohmic contact between the first external electrode and the ceramic body can be ensured satisfactorily and the resistance change caused by the thermal shocks can be reduced.

In addition, the above-mentioned numerical ranges are particularly effective when the size L of the chip-type semiconductor ceramic electronic component (i.e., the length of the side surface of the chip-type semiconductor ceramic electronic component in the lengthwise direction) is 2 mm or less.

The grounds for the above-mentioned numerical ranges will be described below.

First, the curvature radius R (μm) of the corner portion is set so as to satisfy $20 \leqq R \leqq 50$. If the radius R is smaller than 20 μm, the distance between the side surface and the end surface of the chip-type semiconductor ceramic electronic component 1, for example, is necessarily reduced, and the diffusion of the first external electrodes 3*a* and 3*b* may cause some influence upon the variation in resistance values. If the radius R is larger than 50 μm, there may arise a risk of the so-called tombstone phenomenon that, when the chip-type semiconductor ceramic electronic component 1 is mounted, an end surface portion of the chip-type semiconductor ceramic electronic component 1 is attracted toward the substrate by the tensile force of a solder and the chip-type semiconductor ceramic electronic component 1 is mounted in a raised state.

Further, assuming that the maximum thickness of the layer of the first external electrode, which is in contact with the ceramic body, measured from the end surface of the ceramic body is y (μm), and the minimum thickness of the layer of the second external electrode, which is in contact with the side surface of the ceramic body, measured from the apex A of the corner portion of the ceramic body is x (μm), $-0.4x+0.6 \leqq y \leqq 0.4$ is satisfied on condition of $0.5 \leqq x \leqq 1.1$, and $-0.0076x+0.16836 \leqq y \leqq 0.4$ is satisfied on condition of $1.1 \leqq x \leqq 9.0$. Here, the thickness y of the layer of the first external electrode, which is in contact with the ceramic body, is considered as a maximum thickness measured from the end surface of the ceramic body. Also, when the second external electrodes are formed by applying and baking a conductive paste, the thickness of each second external electrode is generally smallest in the corner portion of the ceramic body (see FIG. 2). Therefore, the thickness x of the layer of the second external electrode, which is in direct contact with the side surface of the ceramic body, can be considered as a distance from the apex A of the corner portion of the ceramic body to an outer surface of the thinnest layer portion that is present on a radial extension from the apex A, i.e., a minimum thickness measured from the apex A of the corner portion of the ceramic body.

Figure 5:
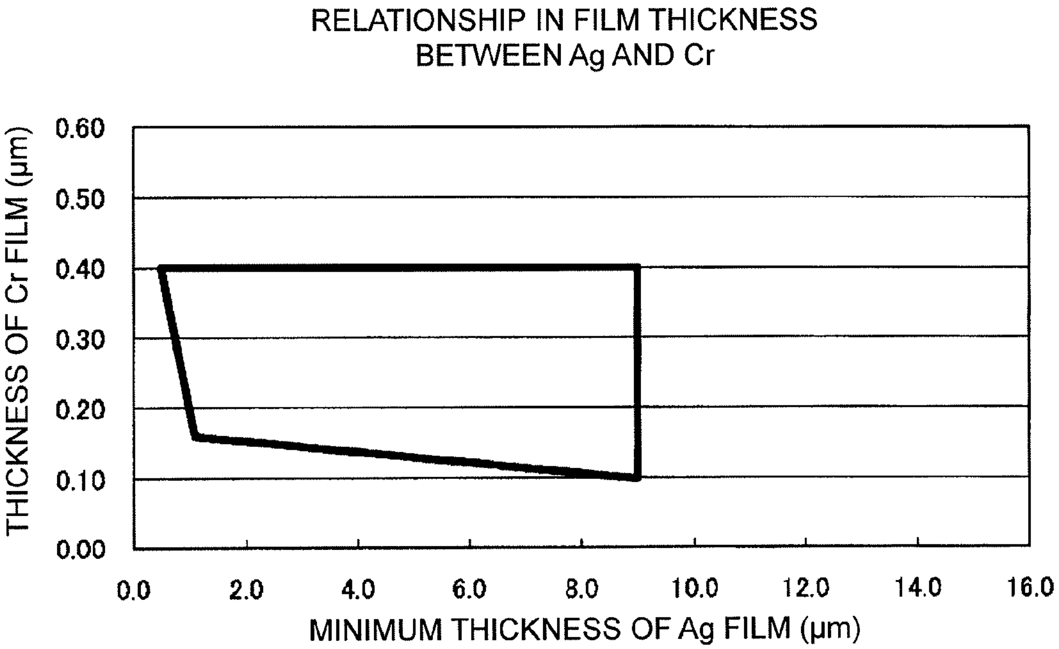
FIG. 5 is a graph representing the relationship in thickness between the first external electrode and the second external electrode.
Figure 6:
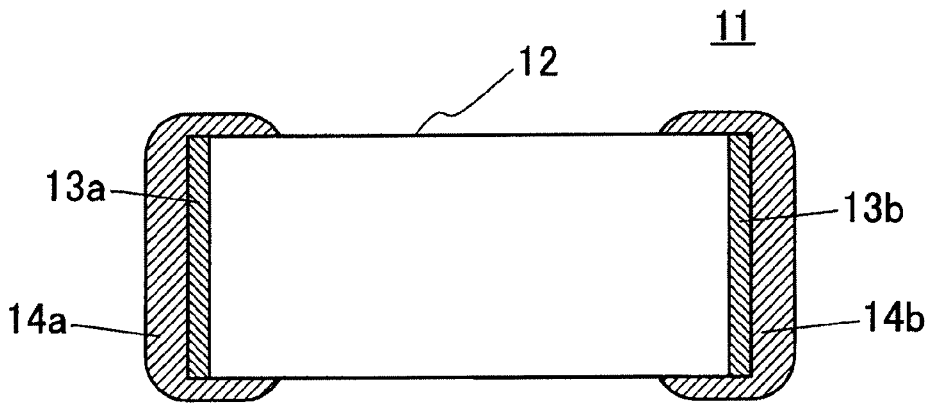
FIG. 6 PRIOR ART
FIG. 6 is a sectional view of a known chip-type semiconductor ceramic electronic component.
Figure 7:
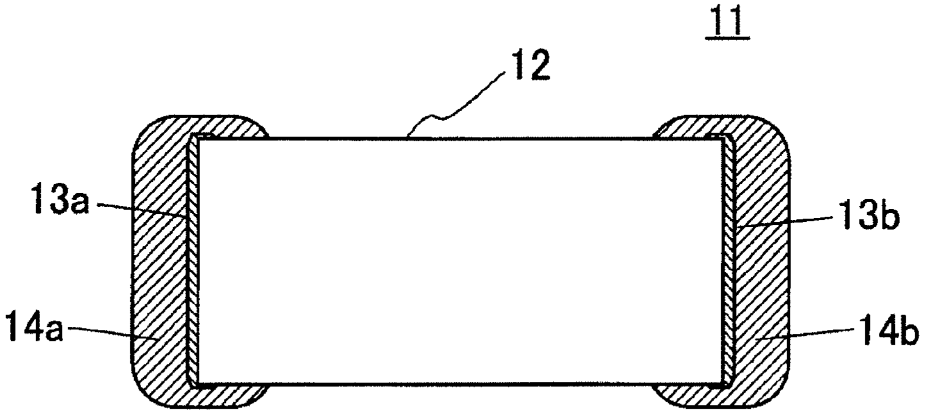
FIG. 7 PRIOR ART
FIG. 7 is another sectional view of the known chip-type semiconductor ceramic electronic component illustrated in FIG. 6.
Figure 8:
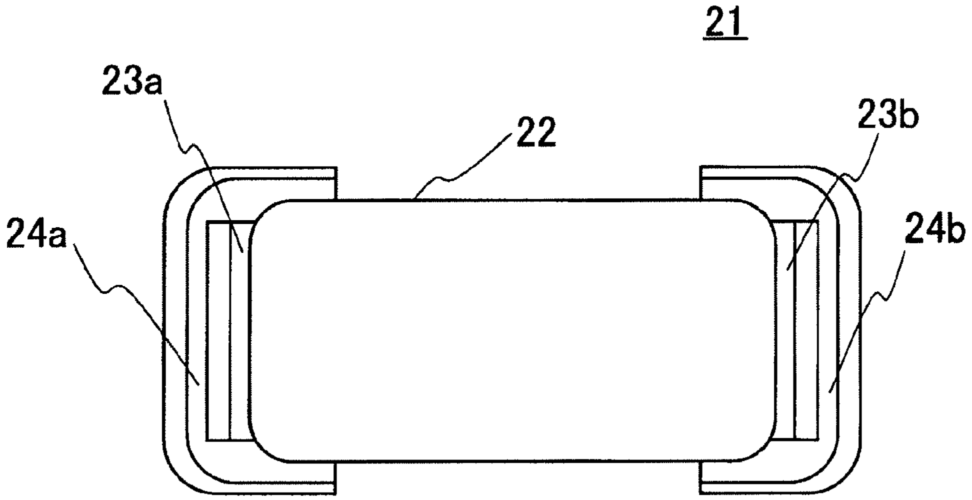
FIG. 8 PRIOR ART
FIG. 8 is a sectional view of another known chip-type semiconductor ceramic electronic component.

FIG. 5 is a graph representing the relationship in thickness between the first external electrode and the second external electrode. The above-mentioned numerical ranges correspond to a region surrounded by fat lines in FIG. 5. As seen from FIG. 5, the minimum thickness of the second external electrode requires to be increased as the layer of the first external electrode, which is in contact with the ceramic body, has a smaller thickness. The reason that the inventors have found is as follows. If the layer of the first external electrode is thin, the first external electrode is oxidized when the layer of the second external electrode is applied and baked. Such oxidation promotes the diffusion of the first external electrode into the second external electrode. By forming the second external electrode in a larger thickness, the amount of an organic material ingredient present in the conductive paste, which is coated to form the second external electrode, is increased relatively and the first external electrode is less susceptible to oxidation. As a result, the oxidation of the first external electrode can be prevented and the first external electrode can be prevented from diffusing into the second external electrode present on the end surface of the ceramic body. On the other hand, if the layer of the first external electrode, which is in contact with the ceramic body, is comparatively thick, the minimum thickness of the second external electrode may be comparatively thin. The reason is that, because the first external electrode is sufficiently thick, the surface of the first external electrode is less susceptible to oxidation than the case where the first external electrode is thin, and the first external electrode is harder to diffuse into the second external electrode. Further, with the first external electrode being sufficiently thick, the ohmic contact between the first external electrode and the ceramic body can be satisfactorily ensured even when the diffusion of the first external electrode occurs to some extent.

The above-described point is new finding. On the basis of the new finding, the inventors have conducted experiments and confirmed the numerical ranges expressed by the relationships of $-0.4x+0.6 \leqq y \leqq 0.4$ on condition of $0.5 \leqq x \leqq 1.1$, and $-0.0076x+0.16836 \leqq y \leqq 0.4$ on condition of $1.1 \leqq x \leqq 9.0$.

If the lower limit of x is less than 0.5 μm, the second external electrode is too thin, thus causing a problem that the oxidation of the first external electrode cannot be sufficiently suppressed, the resistance value is increased, and the variation in resistance values is also increased. If the upper limit of x is more than 9.0 μm, the size of the corner portion necessarily exceeds 50 μm, thus causing a risk of the tombstone phenomenon.

Further, if the lower limit of y is less than the value satisfying the above-mentioned relational expression, the first external electrode is too thin, whereby satisfactory ohmic contact cannot be obtained even when the second external electrode is sufficiently thick, due to the occurrence of surface oxidation and insufficient bonding between the ceramic body and the first external electrode. Hence, the resistance value is increased, and the variation in resistance values is also increased. If the upper limit of y is more than 0.4 μm, the thickness of the first external electrode is so increased as to make the first external electrode more apt to extend over the side surface of the ceramic body, and to cause the variation in resistance values.

In the present invention, preferably, the first external electrodes 3*a* and 3*b* are thin-film electrodes, and the second external electrodes 4*a* and 4*b* are thick-film electrodes. The first external electrodes 3*a* and 3*b* can be formed by using suitable one of various thin-film forming methods, such as sputtering and vapor deposition. Also, the second external electrodes 4*a* and 4*b* can be formed by using suitable one of various methods including, e.g., steps of applying a paste of the material for the second external electrode and performing heat treatment at a predetermined temperature, and steps of immersing the ceramic body in a solution of the material for the second external electrode and performing heat treatment to bake the coated solution. The content rate of the organic ingredient in the material for the second external electrode is preferably about 15 wt % to 30 wt % when the conductive paste for the second external electrode is assumed to be 100 wt %.

Though not illustrated, electrodes may be formed on surfaces of the second external electrodes 4*a* and 4*b* in the present invention by plating of, e.g., Ni, Sn or a solder. The presence of those electrodes improves reliability in connection between the electronic component and the substrate when the electronic component is mounted onto the substrate. Further, an insulating layer (not shown), such as a resin layer or a glass layer, may be formed on the surfaces of the ceramic body 2. Forming such an insulating layer can make the electronic component less susceptible to influences of external environments and can reduce deterioration of characteristics caused by temperature, humidity, etc.

While the ceramic body 2 according to the present invention may be one for use in a multilayered chip-type semiconductor ceramic electronic component in which a ceramic body has internal electrodes, it is particularly effectively applied to a chip-type semiconductor ceramic electronic component in which a ceramic body has no internal electrodes. The reason is that, in the case of the ceramic body 2 having no internal electrodes, the resistance value of the chip-type semiconductor ceramic electronic component 1 is substantially determined depending on the distance between the first external electrodes 3*a* and 3*b*, and hence even small deviations in shape and diffused state of the first external electrodes impose considerable influences upon characteristics of each chip-type semiconductor ceramic electronic component.

Steps of manufacturing the chip-type semiconductor ceramic electronic component 1 according to the present invention will be described below in connection with one embodiment.

First, predetermined amounts of $BaCO_3$, $TiO_2$ and a semiconductor-forming agent, such as $Er_2O_3$, are weighed as ceramic materials. The weighed materials are loaded into a ball mill together with pulverization balls of partly stabilized zirconia (hereinafter referred to as "PSZ balls"), for example, and are sufficiently pulverized with wet mixing. Thereafter, the pulverized materials are calcined at predetermined temperature (e.g., 1000 to 1200° C.) to prepare ceramic powder.

Then, an organic binder is added to the obtained ceramic powder, and a mother substrate not yet fired is prepared through granulation and shaping. Such a mother substrate is subjected to a binder removing process and then to firing in an open-air atmosphere at predetermined temperature (1200 to 1400° C.), thus obtaining a fired mother substrate.

Subsequently, the first external electrodes 3*a* and 3*b* made of the material having an ohmic property with respect to the ceramic body are formed on the mother substrate by the thin-film forming method, such as sputtering or vapor deposition. Then, the mother substrate is cut into shapes of individual thermistor devices. Further, the ceramic body including the first external electrodes 3*a* and 3*b* formed thereon is polished for a predetermined time with addition of cobbles (balls), abrasive powder, etc., to thereby form the surfaces of the ceramic body and the curved surfaces of the corner portions.

The structure according to the present invention that the outer peripheral edges of the first external electrodes 3*a* and 3*b* are formed inward of the outer peripheral edges of the end surfaces of the ceramic body can be effectively prepared by, after forming the first external electrodes on the mother substrate, cutting the mother substrate into shapes of individual thermistor devices and polishing the cut ceramic body for a predetermined time (e.g., 1 to 3 hours) with the aid of not only cobbles having diameters larger than one side of the end surface of the ceramic body, but also abrasive powder.

As described above, the ceramic body is fabricated in which the first external electrodes 3*a* and 3*b* are formed, the curved surfaces are formed in the corner portions thereof, and the outer peripheral edges of the first external electrodes 3*a* and 3*b* are formed inward of the outer peripheral edges of the end surfaces of the ceramic body. Subsequently, the second external electrodes 4*a* and 4*b* are formed by applying a paste for the second external electrodes 4*a* and 4*b* so as to cover the opposite end surfaces of the ceramic body and part of the side surfaces thereof, and then baking it by heat treatment at 550 to 700° C.

While, in the above-described embodiment, a means for forming the outer peripheral edges of the first external electrodes 3*a* and 3*b* inward of the outer peripheral edges of the end surfaces of the ceramic body 2 is realized by polishing the ceramic body for the predetermined time with the aid of not only cobbles having diameters larger than one side of the end surface of the ceramic body 2, but also abrasive powder, the means is not limited to the described one. Other various methods can also be employed. For example, the first external electrodes 3*a* and 3*b* are previously formed on a principal surface of the mother substrate such that the outer peripheral edges of the first external electrodes 3*a* and 3*b* are formed inward of positions at which the end surfaces of the ceramic body 2 are to be cut. Then, the mother substrate is cut into the shape of the ceramic body 2 and is polished to form the curved surfaces in the corner portions of the ceramic body 2.

The chip-type semiconductor ceramic electronic component according to the present invention will be described in more detail below in connection with a chip-type positive characteristic thermistor, for example.

Example 1

First, $BaCO_3$, PbO, $SrCO_3$, $CaCO_3$, $TiO_2$, $Er_2O_3$ as a semiconductor-forming agent, $Mn_2O_3$ as a characteristic improving agent, and $SiO_2$ as a sintering aid were prepared as starting materials. The starting materials were weighed so as to provide a mixing ratio expressed in the following formula for samples indicated in Table 1:

$$((Ba,Pb,Sr,Ca)_{0.0096}Er_{0.004})TiO_3+0.0005MnO_2+0.02SiO_2$$

Then, the weighed starting materials were added with pure water and were mixed and pulverized together with PSZ balls by using a ball mill. After drying, the materials were calcined at 1150° C. for 2 hours and were pulverized again together with the PSZ balls by using the ball mill, whereby calcined powder was obtained. Next, an acrylic acid-based organic binder, a dispersant, and water were added to the calcined powder, and they were mixed for 15 hours together with the PSZ balls by using the ball mill. A ceramic material was then obtained through granulation and drying.

Subsequently, a mother substrate not yet fired was formed by using the ceramic material obtained as described above. After removing the binder, the not-yet-fired mother substrate was fired while temperature was gradually raised to a maximum firing temperature of 1360° C. A sintered mother substrate was thus obtained. After polishing the obtained mother substrate by lapping, the first external electrodes were formed, as electrodes having an ohmic property with respect to the ceramic body, through steps of forming a Cr layer by sputtering and further forming a CuNi layer and an Ag layer successively by sputtering such that the Cr layer had a thickness indicated in Table 1 in each of final completed products.

Then, the mother substrate was cut into the size of a chip-type thermistor device, i.e., dimensions of 0.93 mm (L)×0.48 mm (W)×0.48 mm (H), by using a dicer. Further, cobbles having diameter of 3 mm, alumina powder, and water were prepared, and the cut ceramic body was polished by using a barrel apparatus such that the curvature radius R of the corner portion of the thermistor body was adjusted to a value indicated in Table 1 for each of samples 1 to 21. The value of the curvature radius R was adjusted by changing a polishing time in the range of 10 minutes to 8 hours. The longer the polishing time, the larger was the curvature radius of the corner portion. For each of the samples 1 to 21, it was confirmed that the outer peripheral edges of the first external electrodes were each formed to be positioned closer to a center of the end surface of the ceramic body than the apex of the corner portion of the ceramic body.

Next, the ceramic body including the first external electrodes formed thereon was immersed in a conductive paste bath that contained Ag, as a main ingredient, to form the second external electrodes not having an ohmic property with respect to the ceramic body. After lifting the ceramic body from the bath, a baking process was performed for 30 minutes at 600° C. Finally, a Ni film and a Sn film were successively formed on surfaces of the second external electrodes by electrolytic plating. The chip-type positive characteristic thermistor was thus obtained. In the chip-type positive characteristic thermistor obtained, the thickness of the Cr layer represents its maximum thickness measured from the end surface of the ceramic body, and the thickness of the Ag layer represents its minimum thickness measured from the apex A of the corner portion of the ceramic body.

The chip-type positive characteristic thermistor obtained in such a manner was prepared in number 100 for each of different conditions and measured for a resistance value at the room temperature of 25° C. by the 4-terminal method. A variation 3 CV (%) in resistance values of the 100 chip-type positive characteristic thermistors was calculated from the following formula (I).

$$\text{resistance value 3 CV(\%)}=\text{standard variance}\times 300/\text{mean value of resistance values of individual chip-type positive characteristic thermistors} \quad (1)$$

Further, a thermal shock test was conducted on the chip-type positive characteristic thermistors obtained as described above. As conditions of the thermal shock test, thermal history was applied by setting one cycle to be made up of 30 minutes at −55° C. and 30 minutes at 150° C., and repeating 1000 cycles. Thereafter, the resistance value of each chip-type positive characteristic thermistor was measured at the room temperature of 25° C. by the 4-terminal method. A change rate of the resistance value at the room temperature of 25° C. between before and after application of the thermal history was calculated. Calculated results are also listed in Table 1.

TABLE 1

| Sample number | Curvature radius of corner (μm) | Thickness of Ag layer (μm) x | Thickness of Cr layer (μm) y | Variation in resistance value 3CV (%) | Resistance change caused by thermal shocks (%) |
|---|---|---|---|---|---|
| *1 | 10 | 0.2 | 0.5 | 13.8 | 4.7 |
| *2 | 10 | 0.2 | 0.4 | 12.4 | 5.8 |
| *3 | 10 | 0.2 | 0.2 | 18.9 | 7.7 |
| 4 | 20 | 0.5 | 0.4 | 8.9 | 3.2 |
| *5 | 20 | 0.5 | 0.2 | 10.8 | 6.5 |
| 6 | 25 | 1 | 0.4 | 8.5 | 1.9 |

TABLE 1-continued

| Sample number | Curvature radius of corner (μm) | Thickness of Ag layer (μm) x | Thickness of Cr layer (μm) y | Variation in resistance value 3CV (%) | Resistance change caused by thermal shocks (%) |
|---|---|---|---|---|---|
| 7 | 25 | 1 | 0.2 | 8.8 | 1.6 |
| *8 | 25 | 1 | 0.1 | 11.3 | 10.3 |
| 9 | 26 | 1.1 | 0.16 | 9.1 | 3.8 |
| 10 | 30 | 2.5 | 0.4 | 8.5 | 1.2 |
| 11 | 30 | 2.5 | 0.2 | 8.7 | 1.5 |
| 12 | 30 | 2.5 | 0.15 | 8.9 | 2.7 |
| *13 | 30 | 2.5 | 0.1 | 12.6 | 8.3 |
| 14 | 40 | 5.1 | 0.4 | 8.3 | 1.8 |
| 15 | 40 | 5.1 | 0.2 | 8.4 | 1.6 |
| 16 | 40 | 5.1 | 0.13 | 8.6 | 2.5 |
| *17 | 40 | 5.1 | 0.1 | 13.0 | 7.2 |
| 18 | 50 | 9 | 0.4 | 8.6 | 2.1 |
| 19 | 50 | 9 | 0.2 | 8.4 | 1.7 |
| 20 | 50 | 9 | 0.1 | 8.9 | 2.4 |
| *21 | 50 | 9 | 0.05 | 33.7 | 27.8 |
| *22 | 60 | 16 | 0.4 | — | — |

*indicates that the sample does not fall within the scope of the present invention As seen from Table 1, the variation in resistance values is as small as 10% or less and the resistance change caused by thermal shocks is as small as 5% or less for the samples 4, 6, 7, 9 to 12, 14 to 16, and 18 to 20 in which 0.5≦x≦9.0, 0.1≦y≦0.4, and 20≦R≦50 are satisfied, and further in which y≦−0.4 x+0.6 is satisfied on condition of 0.5≦x≦1.1 and y≦−0.0076 x+0.16836 is satisfied on condition of 1.1≦x≦9.0. On the other hand, for the samples 2 and 3 in which the thickness of the Ag layer is smaller than 0.5 μm, the variation in resistance values is increased to 12.4% and 18.9% and the resistance change caused by thermal shocks is increased to 5.8% and 7.7%, respectively. The reason is that the Ag layer is too thin to suppress oxidation of the Cr layer. Also, for the sample 22 in which the thickness of the Ag layer is larger than 9 μm, the curvature radius R of the corner substantially exceeds 50 μm. Therefore, the tombstone phenomenon occurred, whereby the variation in resistance values and the resistance change caused by thermal shocks could not be measured. Further, for the sample 21 in which the thickness of the Cr layer is smaller than 0.1 μm, the variation in resistance values is increased to 33.7% and the resistance change caused by thermal shocks is increased to 27.8%. The reason is that the Cr layer is too thin and the oxidation of the Cr layer cannot be suppressed even with the Ag layer having a larger thickness. For the sample 1 in which the thickness of the Cr layer is larger than 0.4 the resistance change caused by thermal shocks is small, but the variation in resistance values is increased to 13.8%. The reason is that the Cr layer is too thick and its spreading toward the side surfaces of the ceramic body cannot be suppressed sufficiently. For the samples 5, 8, 13 and 17 in which y<−0.4 x+0.6 is held on condition of 0.5≦x≦1.1 and y<−0.0076 x+0.16836 is held on condition of 1.1≦x≦9.0, the variation in resistance values is increased to the range of 10.8-13.0% and the resistance change caused by thermal shocks is increased to the range of 6.5-10.3%. In general, the larger the curvature radius of the corner portion, the larger is the minimum thickness of the Ag layer serving as the second external electrode, which is formed so as to cover the corner portion, measured from the apex of the corner portion. For the samples 1 to 3 in which the curvature radius of the corner portion is small, it is seen that because the first external electrode is more apt to diffuse into the second external electrode, the variation in resistance values and the resistance change caused by thermal shocks are increased. For the sample 22 in which the curvature radius of the corner portion is large, the variation in resistance values and the resistance change could not be measured due to the occurrence of the tombstone phenomenon in spite of the curvature radius of the corner portion being sufficiently large. Thus, it is understood that the curvature radius of the corner portion is preferably in the range of 20-50 μm.

The invention claimed is:

1. A chip-type semiconductor ceramic electronic component comprising:

a ceramic body made of a semiconductor ceramic;

first external electrodes formed on opposite end surfaces of the ceramic body; and second external electrodes extending to cover surfaces of the first external electrodes and part of side surfaces of the ceramic body, wherein corner portions defined by the side surfaces and the end surfaces of the ceramic body have curved surfaces, and a curvature radius of the corner portion of the ceramic body is R (μm), wherein the first external electrodes are each made of a material having an ohmic property with respect to the ceramic body, and a maximum thickness of a portion of the first external electrode layer in contact with the ceramic body and measured from the end surface of the ceramic body is y (μm), wherein the second external electrodes are each made of a material not having an ohmic property with respect to the ceramic body, and a minimum thickness of a portion of the second external electrode in contact with the side surface of the ceramic body and measured from an apex of the corner portion of the ceramic body is x (μm), and

20≦R≦50,

−0.4 x+0.6≦y≦0.4 when 0.5≦x≦1.1, and

−0.0076 x+0.16836≦y≦0.4 when 1.1≦x≦9.0.

2. The chip-type semiconductor ceramic electronic component according to claim 1, wherein outer peripheral edges of the first external electrodes are positioned closer to a center of the end surface than an apex of the curved surface.

3. The chip-type semiconductor ceramic electronic component according to claim 1, wherein the thickness of the first external electrodes is less than the thickness of the second external electrodes.

4. The chip-type semiconductor ceramic electronic component according to claim 1, wherein the first external electrode layer comprises a plurality of layers, and a layer of the plurality of first external electrode layers which is in contact with the ceramic body is a Cr layer, wherein the second external electrode comprises a plurality of layers, and wherein a layer of the plurality of second external electrode layers which is in contact with the side surface of the ceramic body is an Ag layer.

5. The chip-type semiconductor ceramic electronic component according to claim 1, wherein the ceramic body is an N-type semiconductor having a positive resistance-temperature characteristic, the first external electrode contains a base metal selected from the group consisting of Cr, NiCr and Ti, and the second external electrode contains a noble metal selected from the group consisting of Ag and AgPd.

6. The chip-type semiconductor ceramic electronic component according to claim 1, wherein the ceramic body is a P-type semiconductor having a negative resistance-temperature characteristic, the first external electrode contains a noble metal selected from the group consisting of Ag and AgPd, and the second external electrode contains a base metal selected from the group consisting of Cr, CuNi and Ti.

* * * * *